United States Patent
Schmitt et al.

[19]

[11] Patent Number: 6,031,719
[45] Date of Patent: *Feb. 29, 2000

[54] FAN FLANGE RETENTION IN A FAN CARRIER

[75] Inventors: Ty R. Schmitt, Round Rock; R. Steven Mills; Steven L. Sands, both of Austin, all of Tex.

[73] Assignee: Dell USA L.P., Round Rock, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/882,582

[22] Filed: Jun. 25, 1997

[51] Int. Cl.⁷ ........................................... H05K 7/20
[52] U.S. Cl. .................... 361/695; 165/80.3; 361/687; 415/213.1; 454/184
[58] Field of Search .................... 165/80.3, 121–126; 415/213.1, 214.1, 216.1, 178; 416/178, 146 R, 244 R, 247 R; 454/184; 361/687, 694, 695, 719; 248/27.1

[56] References Cited

U.S. PATENT DOCUMENTS

| | | |
|---|---|---|
| 4,858,067 | 8/1989 | Rochelle . |
| 5,042,269 | 8/1991 | Sullivan ........................... 62/285 |
| 5,348,447 | 9/1994 | Redetzke ..................... 416/247 R |
| 5,452,987 | 9/1995 | Bleger et al. .................. 415/214.1 |
| 5,514,036 | 5/1996 | Lin ................................ 454/184 |
| 5,523,917 | 6/1996 | Searby ........................... 361/687 |
| 5,573,383 | 11/1996 | Uemura et al. ................ 417/360 |
| 5,707,282 | 1/1998 | Clements ....................... 454/184 |
| 5,788,566 | 8/1998 | McAnally ...................... 361/695 |
| 5,831,822 | 11/1998 | Hulick .......................... 361/687 |

Primary Examiner—Gerald Tolin
Attorney, Agent, or Firm—Skjerven, Morrill, MacPherson, Franklin & Friel, L.L.P.; David G. Dolezal

[57] ABSTRACT

A fan carrier for mounting a fan in a protective housing of electronic equipment. The fan carrier includes a frame for securing a fan having a flange with a front side and a back side. The fan carrier also includes a first securing device connected to the frame. The first securing device has a first surface. The fan carrier further includes a second securing device connected to the frame. The second securing device has a first surface movable as to the frame. When a fan is secured to the frame, the first surface of the first securing device retains the flange and the first surface of the second securing device retains the flange.

32 Claims, 5 Drawing Sheets

FAN FLANGE RETENTION IN A FAN CARRIER

BACKGROUND OF THE INVENTION

1. Field of the Invention

The present invention relates to mounting a fan in a protective housing of electronic equipment and more particularly to securing a fan in a fan carrier.

2. Description of the Related Art

Electronic components, such as processors, gate arrays, programmable logic, memory chips, disk drive motors, and power supplies generate heat during normal operation. Because these electronic components are usually enclosed within a protective housing such a computer chassis, the heat produced by these components can be trapped within the housing, and thus, cause the temperature to rise within the housing. These high temperatures can damage the semiconductor circuits located within the protective housing or significantly shorten the working life of the electronic components. In some cases, these circuits may catastrophically fail due to the high temperatures. One common method of reducing the temperature inside the protective housing of electronic systems is to use a fan to circulate the air inside the housing and to bring in cooler air from outside the housing.

A fan carrier can be used to mount a fan in the protective housing of an electronic system such as a computer system. Typically, a fan carrier retains the fan and allows for the easy installation and removal of the fan from the protective housing. However, a fan carrier must be specifically designed for the height, width, and depth of the fan to be mounted. Thus, if one wanted to increase the air flow in the protective housing by adding a fan with a greater depth, a new fan carrier would have to be installed as well. Another problem is that fan carriers can increase the complexity and cost of manufacturing electronic systems such as computer systems.

What is needed is a fan carrier that can hold fans of different depths and that is simple to install.

SUMMARY OF THE INVENTION

It has been discovered that providing a fan carrier that retains a flange of a fan advantageously provides a fan carrier that can secure fans of different depths.

More specifically, in one aspect of the invention, a fan carrier includes a frame for securing a fan having a flange with a front side and a back side. The fan carrier also includes a first securing device connected to the frame. The first securing device has a first surface. The fan carrier further includes a second securing device connected to the frame. The second securing device has a first surface movable as to the frame. When a fan is secured to the frame, the first surface of the first securing device retains the flange and the first surface of the second securing device retains the flange.

In another aspect of the invention, a computer system includes a housing having an outer panel with at least one perforation for airflow. The computer system also includes a processor located within the housing and a memory electrically coupled to the processor. The memory is located within the housing. The computer system also includes a fan having a flange with a front side and a back side and a fan carrier secured to the outer panel. The fan carrier includes a frame and a first securing device connected to the frame. The first securing device has a first surface. The fan carrier also includes a second securing device connected to the frame. The second securing device has a first surface movable as to the frame. Wherein the fan is secured to the frame, the first surface of the first securing device retaining the flange and the first surface of the second securing device retaining the flange.

In another aspect of the invention, a computer system includes a housing having an outer panel with at least one perforation for airflow. The computer system also includes a processor located within the housing and a memory electrically coupled to the processor. The memory located within the housing. The computer system also includes a fan having a flange with a front side and a back side. The fan, when operating, provides air flow to cool the processor. The computer system further includes a first securing device coupled to the outer panel. The first securing device having a first surface. The computer system further includes a second securing device coupled to the outer panel. The second securing device has a first surface movable as to the outer panel. Wherein the fan is secured to the outer panel, the first surface of the first securing device retaining the back side of the flange and the first surface of the second securing device retaining the back side of the flange.

Providing a fan carrier having a first securing device and having a second securing device movable as to a frame advantageously provides a fan carrier which simplifies the installation of a fan in a housing for electronic equipment.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

The following sets forth a detailed description of the best contemplated mode for carrying out the invention. The description is intended to be illustrative of the invention and should not be taken to be limiting.

Figure 1:
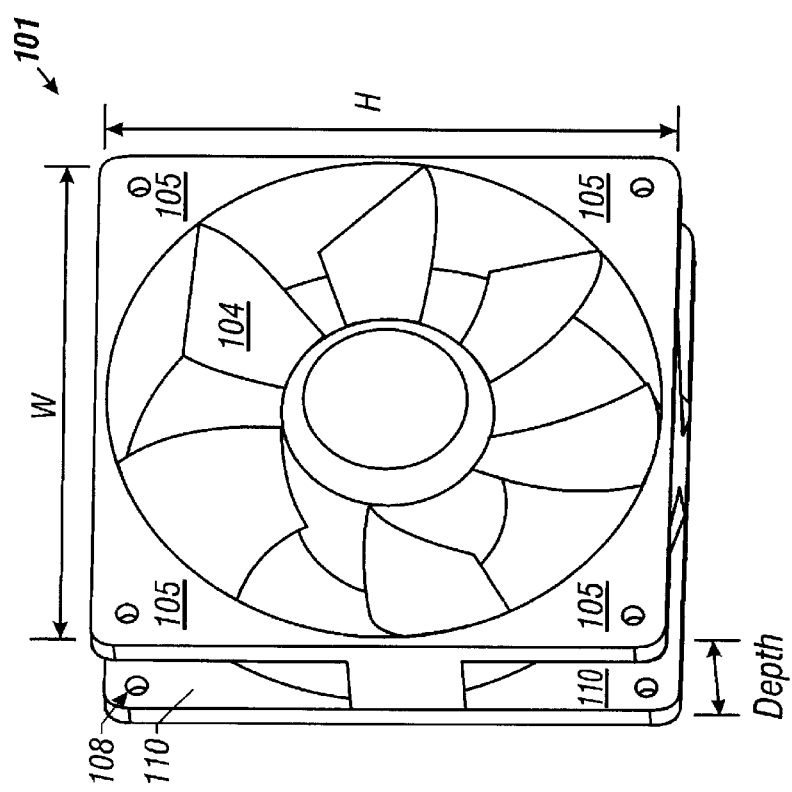
FIG. 1 is a perspective view of one embodiment of a fan.

Referring to FIG. 1, in the embodiment shown, fan 101 is a direct current (DC) brushless fan used to provide air movement for a protective housing of an electronic system such as a computer system. The fan motor (not shown) rotates the fan blades 104 to move air in a direction generally perpendicular to the height and width dimensions shown in FIG. 1.

Fan 101 also includes two flanges 105 and 110 with mounting holes 108. In the embodiment shown, flanges 105 and 110 are generally flat and rectangular with a hole or large perforation in the middle for the fan motor and fan blades 104. The air flow produced by the fan 101 is generally perpendicular to the flat surface of the flanges. Fan 101 has a width, height, and depth dimensions that are usually standardized within the industry. Generally, a fan with a greater depth can move more air than a fan of the same width and height but with a lesser depth. In one embodiment, fan 101 is an NMB, 4715 KL series fan.

Figure 2:
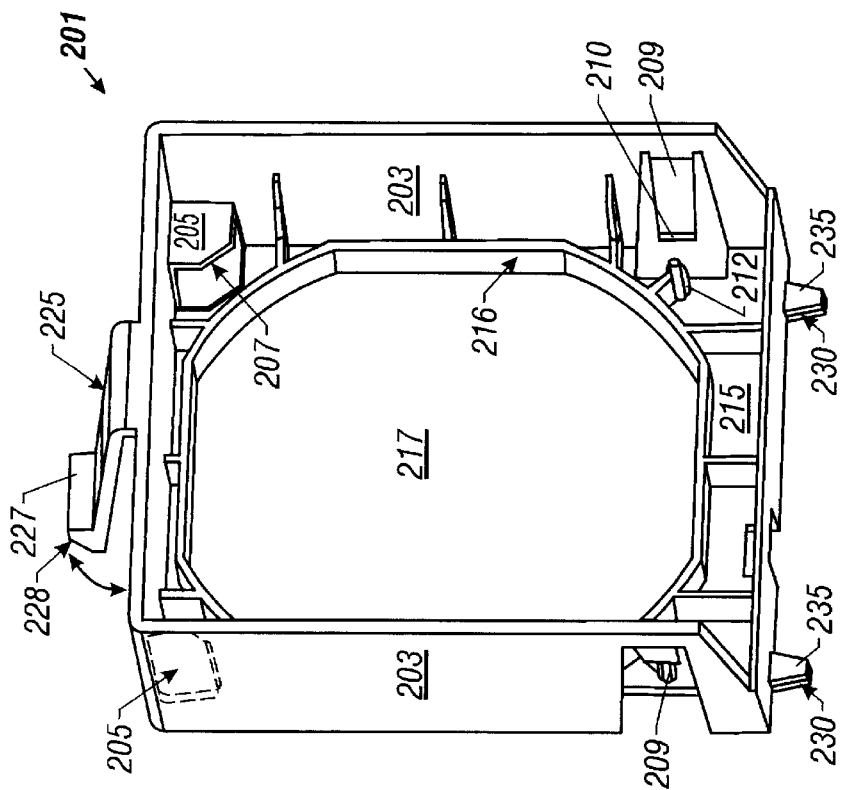
FIG. 2 is a perspective view of one embodiment of a fan carrier according to the present invention.

FIG. 2 shows one embodiment of a fan carrier 201 used to secure or trap the fan 101 to enable the fan 101 to be mounted in protective housing. In the embodiment shown, the fan carrier 201 includes a frame 203 that generally surrounds the fan on three sides. The frame 203 also includes a front panel 215 that has a large perforation 217 for air flow. Attached to the front panel 215 and located next to the large perforation 217 is a ridge 216 which is used to retain flange 110 when the fan 101 is secured to the fan carrier 201 and to increase the separation between flange 110 and the front side of the front panel 215 (the back side of panel 215 with respect to the view shown in FIG. 2). The fan carrier 201 also includes flange ledges 205 located in the upper portion of the carrier 201, relative to the view shown in FIG. 2. Ledges 205 are flat pieces that extend from the top corners of frame 203, relative to the view shown in FIG. 2. These ledges have a retaining surface 207 located on the back side of the retaining ledge 205, relative to the view shown in FIG. 2. These retaining surfaces 207 retain the back side of flange 110 to secure the fan 101 within the carrier 201. The carrier 201 also includes other types of securing devices 209 which, in the embodiment shown, are cantilever snaps. These snaps 209 have a surface 210 for retaining the back side of flange 110 when the fan is secured in the carrier. Snaps 209 are movable with respect to the frame 203 from which they are attached. Fan carrier 201 also includes mounting posts 212 located in the bottom part of the fan carrier 201 relative to the view shown in FIG. 2. These posts 212 fit in the mounting holes 108 of fan 101 when fan 101 is secured in the carrier 201.

The fan carrier 201 also includes frame securing devices which are, in the embodiment shown, a cantilever snap 225 with a securing surface 227 and tabs 230. These securing devices are used to mount the carrier 201 to a panel 601 of an electronic system housing (see FIG. 7).

In the embodiment shown, fan carrier 201 is of a plastic material. Also in the embodiment shown, fan carrier 201 is of a unibody construction or is of a single piece of material. The frame 203, snaps 209, retaining ledges 205, tabs 230, and the frame securing device 225 are all formed in the same plastic mold. However, in other embodiments, some of the items, such as the exterior securing device 225, may be made separately and then later attached with devices such as screws, rivets, or glue.

Figure 3:
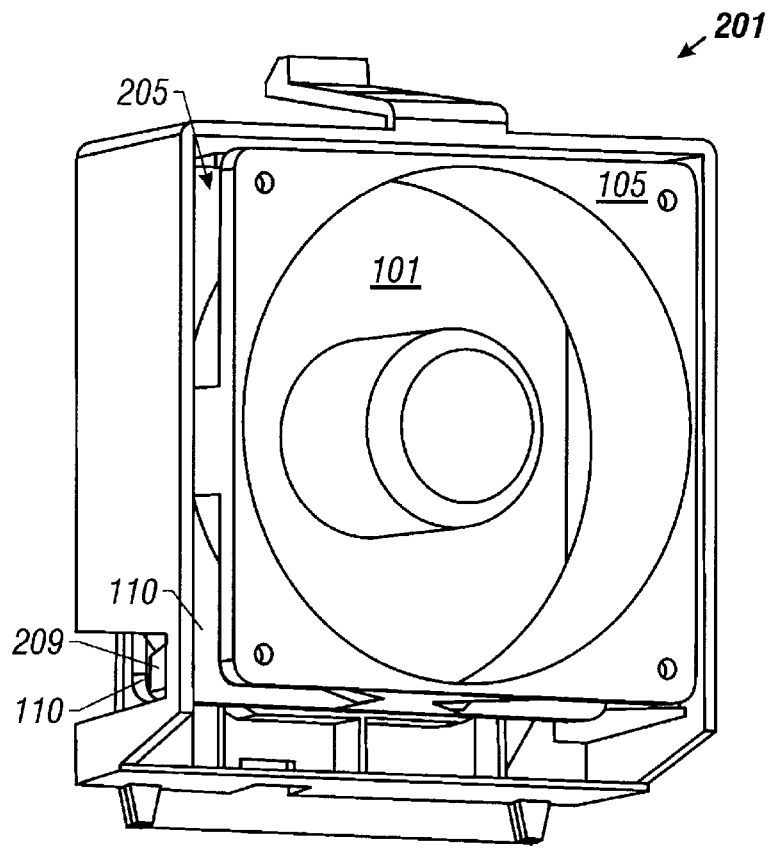
FIG. 3 is a perspective view of one embodiment of a fan mounted in a fan carrier according to the present invention.

FIG. 3 shows the fan 101 (without the fan blades 104) secured or trapped within the fan carrier 201. Snap 209 is providing a retaining force against the back side of flange 110 as shown in the lower left hand corner of FIG. 3. Flange ledge 205 is providing a retaining force against the back side of flange 110 as shown in the upper left hand corner of FIG. 3. Because securing devices 205 and 209 secure fan 101 to carrier 201 by providing a retaining force against the back side of flange 110, carrier 201 can secure or trap fans of varying depths.

Figure 4:
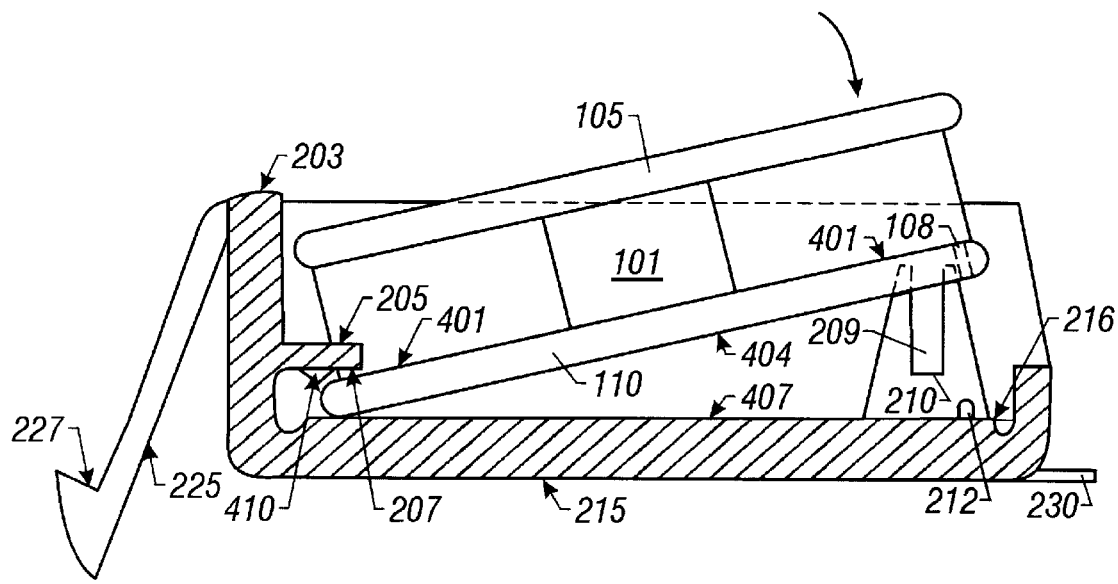
FIG. 4 is a cut-away side view of one embodiment of a fan being inserted into a fan carrier according to the present invention.

FIG. 4 shows a cut away side view of fan 101 partially inserted fan into carrier 201. To secure fan 101 in the fan carrier 201, the left corners of flange 110, relative to the view shown in FIG. 4, are inserted and slid underneath the fan ledges 205 to a position where the back side 401 of flange 110 generally faces the retaining surface 207 of flange ledge 205. Next, the right portion of fan 101, relative to the view shown in FIG. 4, is pushed downward to where the bottom side 404 or front side of flange 110 rests on the top surface 407 of ridge 216 and where mounting posts 212 reside in mounting holes 108. This downward movement, relative to the view shown in FIG. 4, of the right side of fan 101 causes the cantilever snaps 209 to move away from the fan, or for snap 209 to move into the page, relative to the view shown in FIG. 4. When the front side 404 of flange 110 is resting against the top surface 407 of ridge 216, snap 209 is then moved forward, relative to the view shown in FIG. 4, to a location where the retaining surface 210 of snap 209 provides a retaining force against the back side 401 of flange 110. (See FIG. 5A).

In the embodiment shown, snaps 209 are pre-loaded or biased to provide a force downward on the back side 401 of flange 110 when the fan 101 is secured to carrier 201. This downward force acts to tightly secure flange 110 to the top surface 407 of ridge 216, and thus, prevents fan 101 from rattling when operating. The under side or retaining surface 207 of retaining ledge 205 includes a "crushing rib" 410 that is used to tightly secure flange 110 against the top surface 407 of ridge 216. This crushing rib 410 is typically made of plastic material that compresses when pressure is applied to it. With fan carrier 201, the amount that the rib 410 compresses varies with the depth of flange 110. Thus, rib 410 enables the ledge 205 to tightly retain flange 110 against the top surface 407 of ridge 216 and prevents fan 101 from rattling during operation.

Figure 5A:
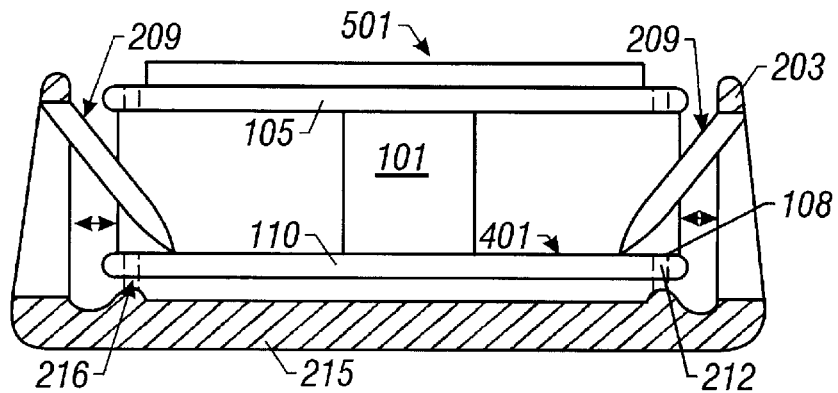
FIG. 5A is a cut-away side view of one embodiment of a fan secured in a fan carrier according to the present invention.
Figure 5B:
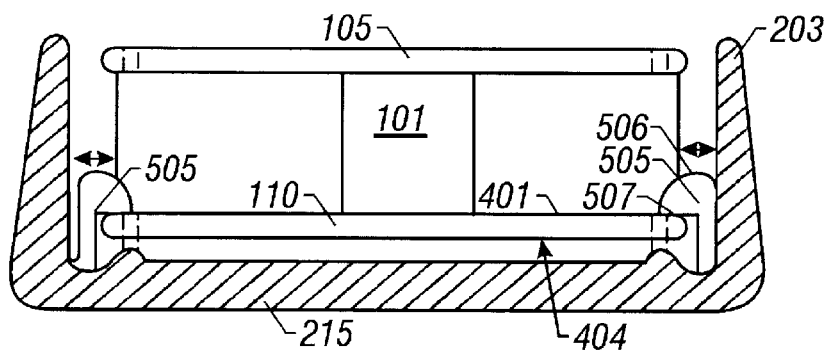
FIG. 5B is a cut-away side view of one embodiment of a fan secured in a fan carrier according to the present invention.
Figure 5C:
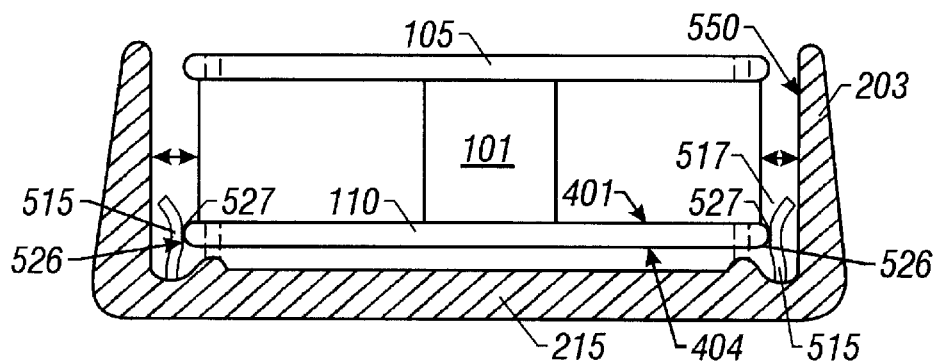
FIG. 5C is a cut-away side view of one embodiment of a fan secured in a fan carrier according to the present invention.

FIGS. 5A, 5B, and 5C show cut-away side views of three alternative embodiments of the fan carrier. FIG. 5A shows a fan carrier where the snaps 209 are cantilever snaps that are connected to the frame 203 at a location that is outward at the back side 401 of flange 110. These snaps 209 are moveable as to the frame 203 in the directions shown by the arrows in FIG. 5A. The snap 209 are pre-loaded to produce a downward force upon the back side 401 of flange 110, relative to the view shown in FIG. 5A. When inserting the fan 101 into the fan carrier of embodiment 5A, the flange 110 pushes the snaps 209 outward, relative to the view shown in FIG. 5. To secure the fan to the fan carrier 201, the user pushes the snaps 209 inward to where the snaps 209 apply a downward force on flange 110. To remove the fan 101 from the fan carrier of FIG. 5A, the user simply moves the snaps 209 outward from their position shown in FIG. 5A to where the snaps 209 are clear from the flange 110.

FIG. 5A also shows a finger guard 501 attached to the outer upper surface of fan 101, relative to the view shown in FIG. 5A. Finger guard 501 prevents a user's fingers from getting caught in the fan blades. The fan carrier 201 is designed such that if a user tries to secure the fan within the fan carrier 201 by retaining flange 105 with snaps 209 and fan ledges 205, the fan guard 501 would prevent the user from moving snaps 209 into their locations shown in FIG. 5A. In the embodiment shown, the finger guard 501 acts to increase the effective depth of flange 105 beyond a dimension that can be retained by ledges 205 and snaps 209.

FIG. 5B shows an alternative embodiment of fan carrier 201. In this embodiment, hooks 505 are securing devices that are connected to the carrier at a location that is outward from the front side 404 of flange 110. In embodiment shown, hook 505 has a round head 506 and a retaining surface 507. Hook 505 is moveable with respect to the carrier in the directions shown by the arrows in FIG. 5B. When the fan 101 is forced down upon these hooks 505, the bottom portion 404 of flange 110 pushes against the curved heads 506 forcing the hooks 505 in an outward direction, relative to the view shown in FIG. 5B. When flange 110 clears the curved heads 506, the hooks 505 move toward each other to their locations shown in FIG. 5B. To remove the fan 101 from the carrier shown in FIG. 5B, the user simply moves the hooks 505 away from each other to where flange 110 clears the hooks 505.

FIG. 5C shows an alternative embodiment of fan carrier 201. In the embodiment shown, friction retainers 515 are securing devices that are connected to the carrier at a location that is outward from the front side 404 of flange 110. Friction retainers 515 have slanted portions 517 and retaining surfaces 527. Friction retainers 515 are moveable with respect to the carrier in the directions shown by the arrows in FIG. 5C. When the fan 101 is forced down upon these friction retainers 515 during installation, the bottom portion 404 of flange 110 pushes against the slanted portions 517 forcing the friction retainers 515 in an outward direction, relative to the view shown in FIG. 5C. Because the friction retainers 515 are biased inward, relative to the view shown in FIG. 5C, retaining surfaces 527 of friction retainers 515 provide an inward force against the edge sides 526 of flange 110 when the fan 101 is in the position shown in FIG. 5C. The static friction created by the force of the retaining surface 527 against the edge sides 526 retains the flange 110 thereby preventing the fan from moving in an upward direction, relative to the view shown in FIG. 5C. To remove the fan 101 from the carrier shown in FIG. 5C, the user simply moves the friction retainers 515 away from each other to where surfaces 527 no longer provide inward forces on the edge sides 526 of flange 110. In other embodiments, the fan carrier 201 may include only one friction retainer. In this alternate embodiment, the friction retainer retains the flange by providing an inward force on one edge side 526 of the fan to wedge the opposite edge side 526 against a portion of the inner side 530 of the frame 203. In other embodiments, the retaining surfaces 527 of friction retainers 515 may include gripping surfaces to increase the friction between the retaining surface 527 and the flange ledge 110.

One advantage of the fan carriers shown in FIGS. 5A–5C is that they allow a user to secure a fan to a fan carrier without the use of tools.

Figure 6:
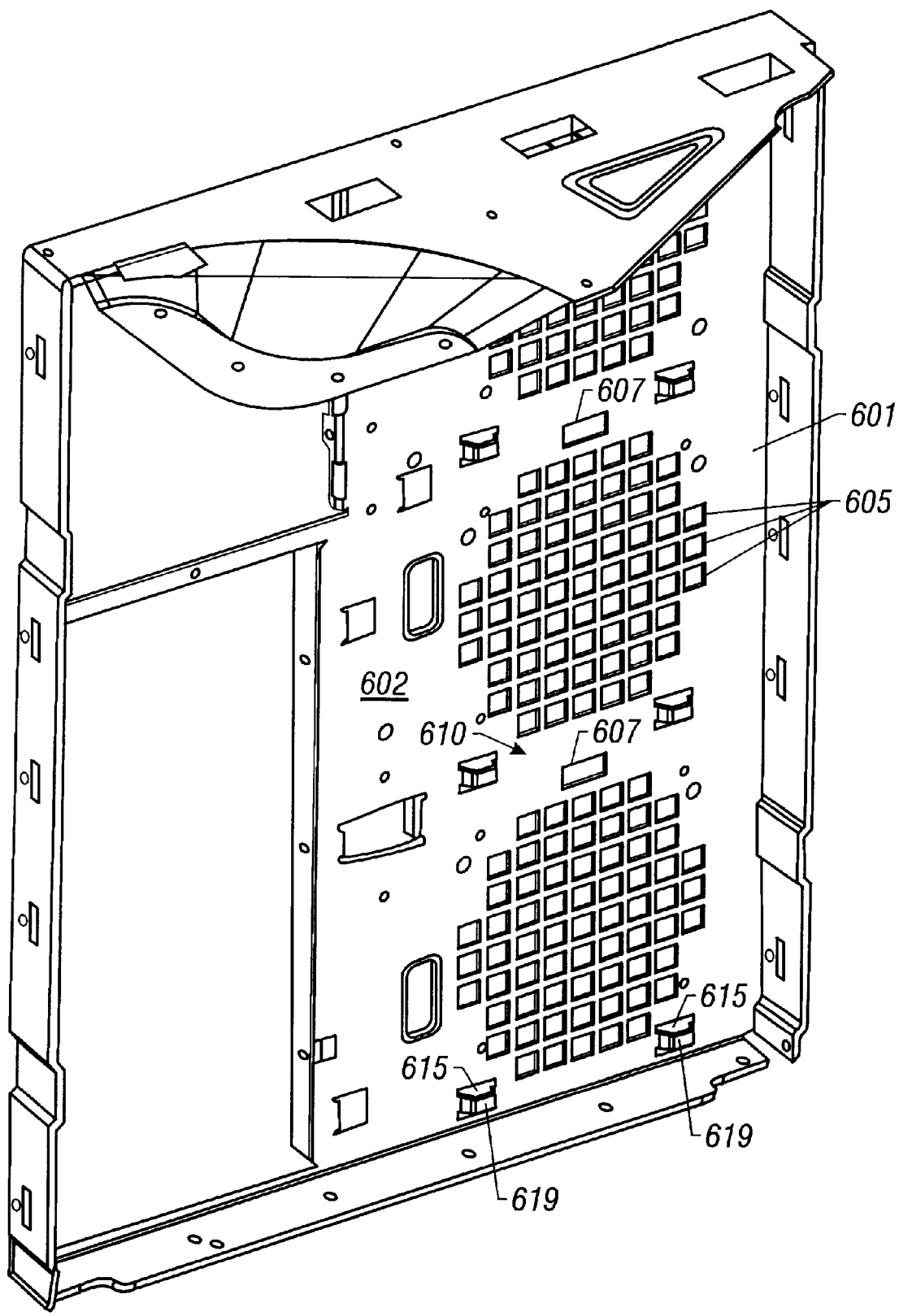
FIG. 6 is a perspective view of an outer panel of an electronics system housing.

FIG. 6 shows an outer panel 601 of a housing for a computer system. Side 602 is the inner side of the outer panel 601 to which a fan carrier 201 can be mounted or secured. Outer panel 601 has several perforations 605 for airflow between the outside and inside of the housing. In the embodiment shown, these perforations 605 are small squares or rectangles located in the proximity of where the fan 101 provides airflow when carrier 201 is mounted to the outer panel 601. These perforations 605 can not exceed certain dimensions in size and in spacing in order for the outer panel 601 to provide adequate electromagnetic interference (EMI) shielding for the computer system. However, these size and spacing requirements of perforations 605 can impede airflow through the outer panel 601. To compensate for this impedance of airflow, fan carrier 201 includes ridge 216 which increases the amount of separation between a fan secured in the fan carrier 201 and the inner side 602 of the outer panel 601 (see FIG. 2). This separation lessens the impedance to airflow due to the size and spacing requirements of perforations 605.

Outer panel 601 also includes perforations 607 located above the air flow perforations 605, relative to the view shown in FIG. 6. These perforations 607 are used to secure fan carriers 201 to the outer panel 601 by providing a retaining surface to retain the retaining surface 227 of frame retaining device 225. Perforations 615 are located below perforations 605, relative to the view shown in FIG. 6, and are also used to the secure the fan carrier 201 to the outer panel. These perforations 615 include a retaining ledge 619 that has a retaining surface located on the outer side of the retaining ledge 619. This retaining surface of retaining ledge 619 retains the inner side 235 of tab 230. Retaining ledge 619 is indented inwards from side 602 such that the retaining surface of retaining ledge 619 resides within the plane of outer panel 601.

To secure the fan carrier 201 to the outer panel 601, a user places the tabs 230 within the retaining ledges 619 to where sides 235 of retaining tabs 230 generally face the back side of retaining ledges 619. The user then rotates the carrier 201 to where the frame securing device 225 and more specifically the retaining surface 227 penetrates through perforation 607. In the embodiment shown, the frame securing device 225 is moveable with respect to the carrier 201. In securing the carrier 201 to the back panel 601, the frame securing device 225 must be moved slightly downward, relative to the view shown in FIG. 6, or in the direction towards the fan carrier 201 (See FIG. 2). In the embodiment shown, this movement downward or inward of the frame securing device 225 is aided by the slanted head 228 of frame securing device 225. As the frame securing device 225 is pushed through perforation 607, the top edge of perforation 607 pushes downward on head 228, relative to the view shown in FIG. 6, and thus pushes the frame securing device 225 downward to where the slanted head 228 has completely penetrated the outer panel 601. Because frame securing device 225 is pre-loaded to the position shown in FIG. 2, as soon as head 228 has completely penetrated perforation 607, the securing device 225 moves away from the carrier 201 to where retaining surface 227 is retained by the front surface of panel 601 at location 610. Thus, the surface 610 of the front side of panel 601 (or the back side relative to the view shown in FIG. 6) retains the retaining surface 227 of securing device 225, and the back sides of retaining ledges 619 (relative to the view shown in FIG. 6) retain the retaining surfaces 235 of tabs 230, all to secure the fan carrier 201 to the outer panel 601 as shown in FIG. 7.

Figure 7:
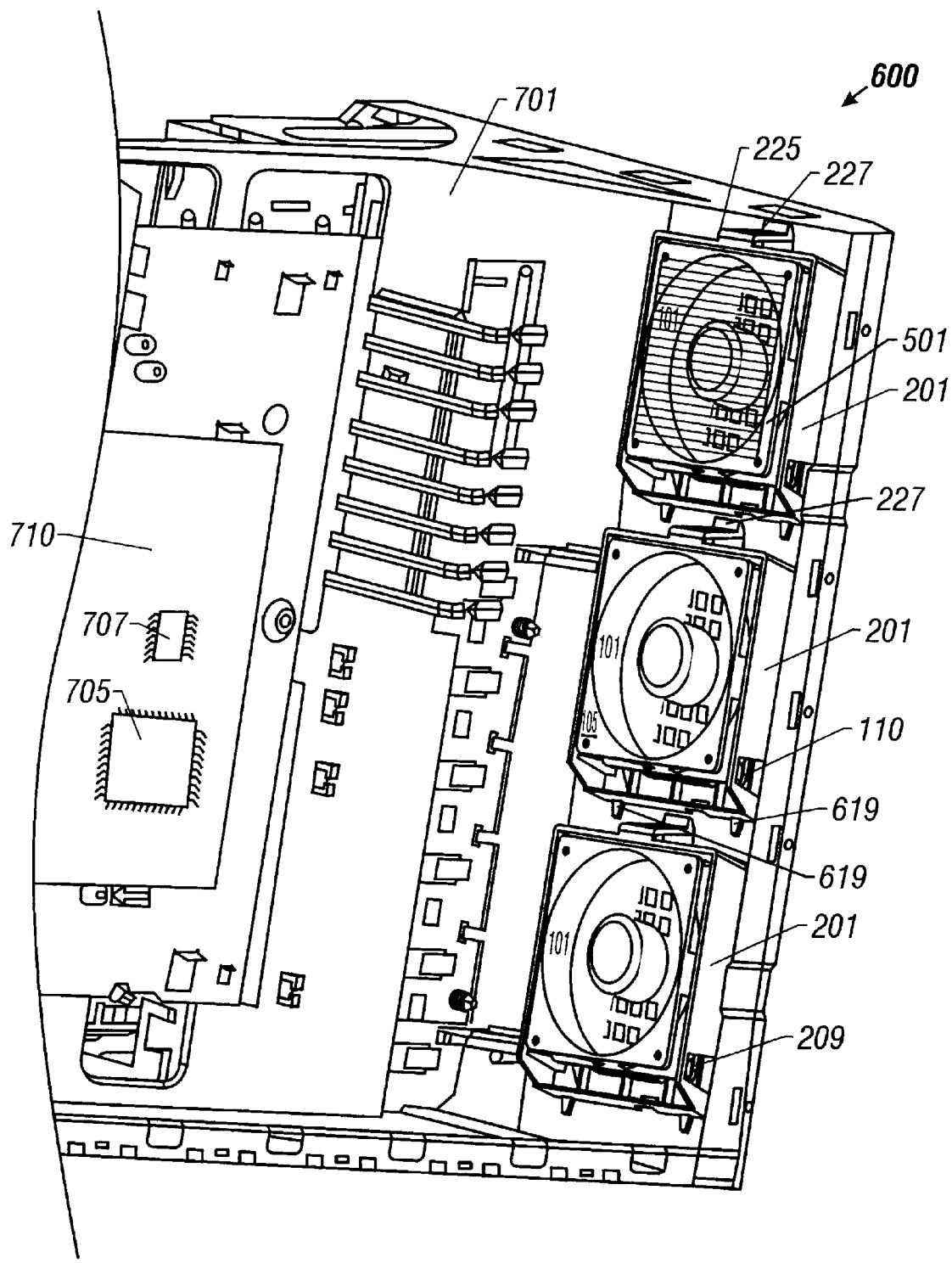
FIG. 7 is a perspective view of the inside portion of a computer system housing.

FIG. 7 shows the inside portion of a computer system housing 701 with an attached outer panel 601. FIG. 7 also shows three fan carriers 201 with fans 101 secured to the outer panel 601. These fans 101 provide for air movement between the inside of the housing and the outside of the housing. FIG. 7 also shows a processor 705 and a memory 707, both mounted to a printed circuit board 710. The memory 707 is electrically coupled to the processor 705. The fans 101 provide air to cool the processor 705, memory 707, and other electronic components within the housing 701. The top fan 101 has an attached fan guard 501. The fan carriers 201 are secured to the back panel 601 by the retaining surfaces 227 of frame securing devices 225 and retaining surfaces 235 of tabs 230. The retaining surface 227 is shown in phantom in FIG. 7.

In the embodiment shown, the outer panel 601 as well as other panels of the housing 701 are of a metal material. In other embodiments, however, the housing may be of a plastic material with a metallic coating or other type of coating to provide electromagnetic shielding.

In other embodiments the housing 701 may include other electronic equipment other than a computer system.

In another embodiment, the retaining ledges 205 and the securing devices 209 may be integrally formed in the outer panel 601 or attached separately to the outer panel. In this alternative embodiment, the retaining ledges 205 and the securing devices 209 retain the backside 401 of flange 101 to secure the fan 101 to the outer panel 601.

In other embodiments, catches, latches, claps, fasteners, other types of snaps, or other types of securing devices may used to retain a flange.

While particular embodiments of the present invention have been shown and described, it will be obvious to those skilled in the art that changes and modifications may be made without departing from this invention and it's broader aspects and, therefore, the appending claims are to encompass within their scope all such changes and modifications as all within the true spirit and scope of this invention.

What is claimed is:

1. A computer system comprising:

a processor;

a housing having a chassis panel with at least one perforation for airflow;

a fan including a first flange and a second flange, and a fan carrier secured to the chassis panel, the fan secured to the fan carier, the fan carrier comprising:
   a frame; and
   at least one securing device, each securing device of the at least one securing device including a retaining surface that engages a portion of a first side of the first flange and retains an outward second side of the first flange directly against the carrier.

2. The computer system of claim 1 wherein a securing device of the at least one securing device includes a flange ledge.

3. The computer system of claim 1 wherein a securing device of the at least one securing device includes a cantilever snap.

4. The computer system of claim 1 wherein a securing device of the at least one securing device is movable with respect to the frame.

5. The computer system of claim 1 wherein a retaining surface of a securing device of the at least one securing device retains a portion of a back side of the first flange to retain the outward side of the first flange against the carrier.

6. The computer system of claim 1 wherein the frame further includes a front panel, the front panel having an opening for air flow, the front panel has a front side and back side, the outward side of the flange faces the back side of the front panel.

7. The computer system of claim 6 wherein the front side of the front panel faces an inner side of the chassis panel.

8. The computer system of claim 6 wherein:

the front side of the front panel faces an inner side of the chassis panel; and the back side of the front panel includes a ridge, the outward side of the first flange is retained against the ridge, the ridge providing separation between the outward side of the first flange and the inner side of the chassis panel.

9. The computer system of claim 1 wherein:

the chassis panel further includes a second perforation;

the fan carrier further includes a frame securing device having a first surface, the frame securing device connected to the frame; and the frame securing device protruding through the chassis panel wherein the first surface of the frame securing device engages the outer side of the chassis panel to provide a securing force for securing the carrier to the chassis panel.

10. The computer system of claim 1 wherein a securing device of the at least one securing device includes a hook.

11. The computer system of claim 1 wherein a securing device of the at least one securing device is connected to the frame at a location outward from a back side of the first flange.

12. The computer system of claim 1 wherein the fan carrier further comprises:

a plurality of external securing devices connected to the frame, each of the plurality having a securing surface engages surfaces of the chassis panel to secure the frame to the chassis panel.

13. The computer system of claim 1 wherein:

the first flange is located on a first side of the fan and the second flange is located on a second side of the fan, the first and second sides of the fan each having a planar surface that lies generally perpendicular to the flow of air through the fan during operation of the fan, the second side of the fan having a guard mounted on the outer side of the second side;

the guard prevents an attempt to secure the second flange to the frame by the at least one securing device.

14. The computer system of claim 1 wherein a securing device of the at least one securing device includes a friction retainer that retains an edge side of the first flange.

15. A fan carrier for an electronic system housing comprising:

a frame having means for securing a fan having a flange; and wherein the securing means includes at least one securing device connected to the frame, each securing device of the at least one securing device including a retaining surface means positioned with respect to the frame for engaging a portion of a first side of the flange to retain an outward side of the flange against the carrier;

wherein the at least one securing device includes a flange ledge within the frame and extending inwardly from a sidewall of the frame, the ledge including means for engaging a portion of the flange of the fan.

16. The fan carrier of claim 15 wherein a retaining surface means of a securing device of the at least one securing device is movable with respect to the frame.

17. The fan carrier of claim 15 wherein:

a securing device of the at least one securing device is positioned with respect to the frame for retaining a back side of the flange.

18. The fan carrier of claim 15 wherein:

the frame further includes a front panel having an opening for air flow, the front panel having a front side and a surface on a back side for retaining the outward side of the flange.

19. The fan carrier of claim 18 wherein the surface on the back side of the front panel is located on a ridge, the ridge providing separation between the first surface on the back side and the front side of the front panel.

20. The fan carrier of claim 15 wherein a securing device of the at least one securing device includes a hook.

21. The fan carrier of claim 15 wherein a securing device of the at least one securing device is connected to the frame at a location outward from its respective retaining surface means.

22. The fan carrier of claim 15 wherein second securing device of the at least one securing device is fixably coupled to the frame.

23. The fan carrier of 15 wherein a securing device of the at least one securing device includes a cantilever snap.

24. The fan carrier of claim 15 wherein a retaining surface means of a securing device of the at least one securing device includes a friction retainer that retains an edge side of the flange.

25. The fan carrier of claim 15 further comprising:

a plurality of external securing devices connected to the frame, each of the plurality having a securing surface to engage surfaces of a mounting panel to secure the frame to the mounting panel.

26. The fan carrier of claim 15 wherein the frame and the at least one securing device are of a unibody construction.

27. The fan carrier of claim 15 wherein the frame and the at least one securing device are of a plastic material.

28. The fan carrier of claim 15 further comprising:

mounting posts for engaging holes in a fan flange.

29. The fan carrier of claim 15 wherein the at least one securing device her includes a second securing device having a retaining surface means fixably coupled to the frame and two securing devices having retaining surface means that are movable with respect to the frame.

30. The fan carrier of claim 29 wherein the second securing device includes a second flange ledge within the frame.

31. The fan carrier of claim 15 wherein the fan ledge is located at a corner of the frame and also extends inwardly from a second sidewall of the frame at the corner.

32. The fan carrier of claim 15 wherein the means for engaging further includes a crushing rib.

* * * * *